(12) United States Patent
Feng et al.

(10) Patent No.: US 10,096,375 B2
(45) Date of Patent: Oct. 9, 2018

(54) SHIFT REGISTER UNIT AND DRIVING METHOD THEREOF, GATE DRIVE CIRCUIT, DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Silin Feng, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/570,714

(22) PCT Filed: Apr. 25, 2017

(86) PCT No.: PCT/CN2017/081824
§ 371 (c)(1),
(2) Date: Oct. 30, 2017

(87) PCT Pub. No.: WO2017/198045
PCT Pub. Date: Nov. 23, 2017

(65) Prior Publication Data
US 2018/0226133 A1    Aug. 9, 2018

(30) Foreign Application Priority Data
May 16, 2016  (CN) .......................... 2016 1 0321721

(51) Int. Cl.
G09G 3/36     (2006.01)
G11C 19/28    (2006.01)
G09G 3/20     (2006.01)

(52) U.S. Cl.
CPC ............. *G11C 19/287* (2013.01); *G09G 3/20* (2013.01); *G09G 2310/0286* (2013.01); *G09G 2310/08* (2013.01)

(58) Field of Classification Search
CPC ................. G09G 3/3677; G09G 5/003; G09G 2310/0286; G09G 2310/08; G09G 2330/021; G11C 19/287
See application file for complete search history.

(56) References Cited

U.S. PATENT DOCUMENTS

2004/0150610 A1* 8/2004 Zebedee ................ G11C 19/28
345/100
2007/0274433 A1* 11/2007 Tobita .................. G09G 3/3677
377/64
(Continued)

FOREIGN PATENT DOCUMENTS

CN    202502720 U    10/2012
CN    102930812     2/2013
(Continued)

OTHER PUBLICATIONS

Applicant, "First Office Action," CN Application No. 201610321721.1 (dated Oct. 27, 2017).
(Continued)

*Primary Examiner* — Nelson Rosario
(74) *Attorney, Agent, or Firm* — Womble Bond Dickinson (US) LLP

(57) ABSTRACT

A shift register unit comprises an input subcircuit for a first node to be a first level when a scan pulse is of the first level, an output subcircuit for driving an output terminal to be a first clock signal level when the first node is at the first level,
(Continued)

a second node control subcircuit for connecting the second node with a second level when either of the scan pulse and the output terminal is of the first level, and connecting the second node with the first level when each of the scan pulse and the output signal is of the second level, a first reset subcircuit for driving the first node to be the second level when the second node is at the first level, and a second reset subcircuit for driving the output signal to be the second level when the second node is at the first level.

20 Claims, 8 Drawing Sheets

(56) References Cited

U.S. PATENT DOCUMENTS

| | | | |
|---|---|---|---|
| 2014/0098013 A1 | 4/2014 | Chen | |
| 2016/0268004 A1 | 9/2016 | Li et al. | |
| 2016/0300542 A1* | 10/2016 | Zhang | G11C 19/28 |
| 2016/0351159 A1 | 12/2016 | Yang et al. | |
| 2016/0372063 A1 | 12/2016 | Li et al. | |
| 2017/0025079 A1 | 1/2017 | Feng et al. | |

FOREIGN PATENT DOCUMENTS

| | | |
|---|---|---|
| CN | 102930812 A | 2/2013 |
| CN | 103226981 | 7/2013 |
| CN | 103226981 A | 7/2013 |
| CN | 104464600 A | 3/2015 |
| CN | 104485086 | 4/2015 |
| CN | 104485086 A | 4/2015 |
| CN | 204406959 U | 6/2015 |
| CN | 104952417 | 9/2015 |
| CN | 105761660 A | 7/2016 |
| KR | 20140148235 | 12/2014 |
| KR | 1020140148235 A | 12/2014 |

OTHER PUBLICATIONS

International Search Report and Written Opinion in PCT/CN2017/081824 dated Jul. 26, 2017, with English translation.

* cited by examiner

SHIFT REGISTER UNIT AND DRIVING METHOD THEREOF, GATE DRIVE CIRCUIT, DISPLAY DEVICE

CROSS REFERENCE TO RELATED APPLICATION

The present application is the U.S. national phase entry of PCT/CN2017/081824, with an international filing date of Apr. 25, 2017, which claims priority to the patent application No. 201610321721.1 filed with the Patent Office of the People's Republic of China on May 16, 2016, the whole disclosure of which is incorporated herein by reference.

TECHNICAL FIELD

The present disclosure relates to the technical field of display, in particular to a shift register unit and its driving method, a gate drive circuit, and a display device.

BACKGROUND

In the field of display, the gate drive circuit (GOA) is a circuit for providing drive signals to the pixel switch in the pixel circuit. The gate drive circuit usually includes a plurality of cascaded gate drive units, which can provide drive signals to pixel units of different rows, and each gate drive unit is actually a shift register unit. Besides, each gate drive unit is connected to at least one high voltage DC terminal and a low voltage DC terminal, the high voltage DC terminal can receive a high-level signal as the working voltage (supply voltage) of the gate drive unit, while the low voltage DC terminal is actually the low-level reference voltage terminal in the circuit of the gate drive unit, which can be considered as the reference ground in said circuit.

However, as far as the existing gate drive circuit is concerned, the high voltage DC terminal and the low voltage DC terminal are usually electrically connected to directly form a DC path during operation, thus causing DC loss. Moreover, with the increase in the usage frequency and working hours of the gate drive circuit, such DC loss accumulates continuously, thereby increasing energy consumption of the display device.

SUMMARY

To overcome the defects in the prior art, the embodiments of the present disclosure provide a shift register unit and its driving method, a gate drive circuit and a display device so as to reduce DC power consumption.

In an aspect, the present disclosure provides a shift register unit comprising an input subcircuit, an output subcircuit, a first reset subcircuit, a second reset subcircuit and a second node control subcircuit. The input subcircuit is connected to a scan pulse input terminal and a first node, and is adapted to drive a voltage of the first node to be a first level when a scan pulse signal is of the first level. The output subcircuit is connected to the first node, a first clock signal input terminal and an output terminal of the shift register unit, and is adapted to drive a voltage of the output terminal to be a level of a first clock signal inputted through the first clock signal input terminal when the voltage of the first node is of the first level, and to maintain the level of the first node when the first node is floating. The second node control subcircuit is connected to the scan pulse input terminal, the output terminal of the shift register unit, a second clock signal input terminal, a second node, a first level DC voltage terminal and a second level DC voltage terminal, and is adapted to connect the second node with the second level DC voltage terminal when either of the scan pulse signal and an output signal of the output terminal is of the first level, and to connect the second node with the first level DC voltage terminal when each of the scan pulse signal and the output signal of the output terminal is of the second level and the second clock signal is of a predetermined level. The first reset subcircuit is connected to the first node and the second node, and is adapted to drive the voltage of the first node to be the second level when the voltage of the second node is of the first level. The second reset subcircuit is connected to the second node and the output terminal, and is adapted to drive the output signal of the output terminal to be the second level when the voltage of the second node is of the first level.

In some embodiments, the second node control subcircuit comprises a first control unit and a second control unit, wherein the first control unit is connected to the second node and the first level DC voltage terminal, and is adapted to connect the second node with the first level DC voltage terminal when the second clock signal is of the predetermined level. The second control unit is connected to the scan pulse input terminal, the output terminal, the second node and the second level DC voltage terminal, and is adapted to connect the second node with the second level DC voltage terminal when either of the scan pulse signal of the scan pulse input terminal and the output signal of the output terminal is of the first level.

In some embodiments, the first control unit comprises a first transistor, with its control terminal connected to the second clock signal input terminal, its first terminal connected to the second node, and its second terminal connected to the first level DC voltage terminal. A turn-on level for the first transistor is the predetermined level.

In some embodiments, the second control unit comprises a second transistor and a third transistor, and turn-on levels for the second transistor and the third transistor are both the first level. A control terminal of the second transistor is connected to the scan pulse input terminal, a first terminal thereof is connected to the second node, and the second terminal thereof is connected to the second level DC voltage terminal. A control terminal of the third transistor is connected to the output terminal, a first terminal thereof is connected to the second node and a second terminal thereof is connected to the second level DC voltage terminal.

In some embodiments, the shift register unit further comprises a global reset control subcircuit, the global reset control subcircuit is connected to the first node and a reset signal input terminal, and is adapted to drive the voltage of the second node to be the first level when a reset signal at the reset signal input terminal is of the first level.

In some embodiments, the global reset control subcircuit comprises a fourth transistor, with its first terminal and control terminal connected to the reset signal input terminal, and its second terminal connected to the second node, and a turn-on level for the fourth transistor is the first level.

In some embodiments, the shift register unit further comprises a voltage stabilizing subcircuit connected to the second node, for maintaining the level of the second node when the second node is floating.

In some embodiments, the voltage stabilizing subcircuit comprises a first capacitor, one terminal of the first capacitor is connected to the second node, and the other terminal of the first capacitor is connected to one of the first level DC voltage terminal and the second level DC voltage terminal.

In some embodiments, the input subcircuit comprises a fifth transistor, with its control terminal connected to the scan pulse input terminal, its first terminal connected to the first level DC voltage terminal, and its second terminal connected to the first node.

In some embodiments, the output subcircuit comprises a sixth transistor and a second capacitor. A control terminal of the sixth transistor is connected to the first node, a first terminal thereof is connected to the first clock signal input terminal, and a second terminal thereof is connected to the output terminal. One terminal of the second capacitor is connected to the first node and the other terminal of the second capacitor is connected to one of the first level DC voltage terminal and the second level DC voltage terminal.

In some embodiments, the first reset subcircuit comprises a seventh transistor, with its control terminal connected to the second node, its first terminal connected to the first node and its second terminal connected to the second level DC voltage terminal.

In some embodiments, the second reset subcircuit comprises an eighth transistor, with its control terminal connected to the second node, its first terminal connected to the output terminal and its second terminal connected to the second level DC voltage terminal.

In some embodiments, each of the first level and the predetermined level is a high level, and the second level is a low level.

In another aspect, the present disclosure provides a driving method for the shift register unit according to any one of embodiments described above. The method comprises providing a scan pulse signal whose effective level is the first level to the scan pulse input terminal; providing a first clock signal to the first clock signal input terminal, and providing a second clock signal to the second clock signal input terminal. A duty ratio for the first level of the first clock signal is same to that of the second clock signal, and both a width of each first level of the first clock signal and a width of each first level of the second clock signal are equal to a width of an effective level of the scan pulse signal.

Moreover, during one time period, a start time of the effective level of the scan pulse signal is an end time of one first level of the second clock signal, and an end time of the effective level of the scan pulse signal is a start time of a first level of the first clock signal, which is adjacent to the effective level of the scan pulse signal.

According to another aspect, the present disclosure provides a gate drive circuit comprising a plurality of cascaded shift register units according to any one of above embodiments.

In yet another aspect, a display device comprising the gate drive circuit according to the above embodiment is provided.

In the embodiments of the present disclosure, by means of the second clock signal, the scan pulse signal inputted through the scan pulse input terminal and the output signal at the shift register output terminal, it is possible to not form a direct DC path between a first voltage input line and a second voltage input line connected to the shift register unit, thus reducing the DC loss.

BRIEF DESCRIPTION OF DRAWINGS

In order to illustrate the technical solutions provided in the embodiments of the present disclosure more clearly, the drawings that are to be used in the descriptions of the embodiments will be introduced briefly below, but apparently, the drawings mentioned in the descriptions below are some embodiments of the invention, and those ordinarily skilled in the art can obtain other drawings from these drawings without inventive efforts.

DETAILED DESCRIPTION OF EMBODIMENTS

In order to make the object, technical solutions and advantages of the embodiments of the present disclosure clearer, technical solutions of the embodiments of the present disclosure will be described clearly and completely below with reference to the drawings, but obviously, the described embodiments are merely some instead of all of the embodiments of the invention. All other embodiments obtained by those skilled in the art on the basis of the embodiments of the present disclosure shall fall into the scope of the present invention.

Figure 1:
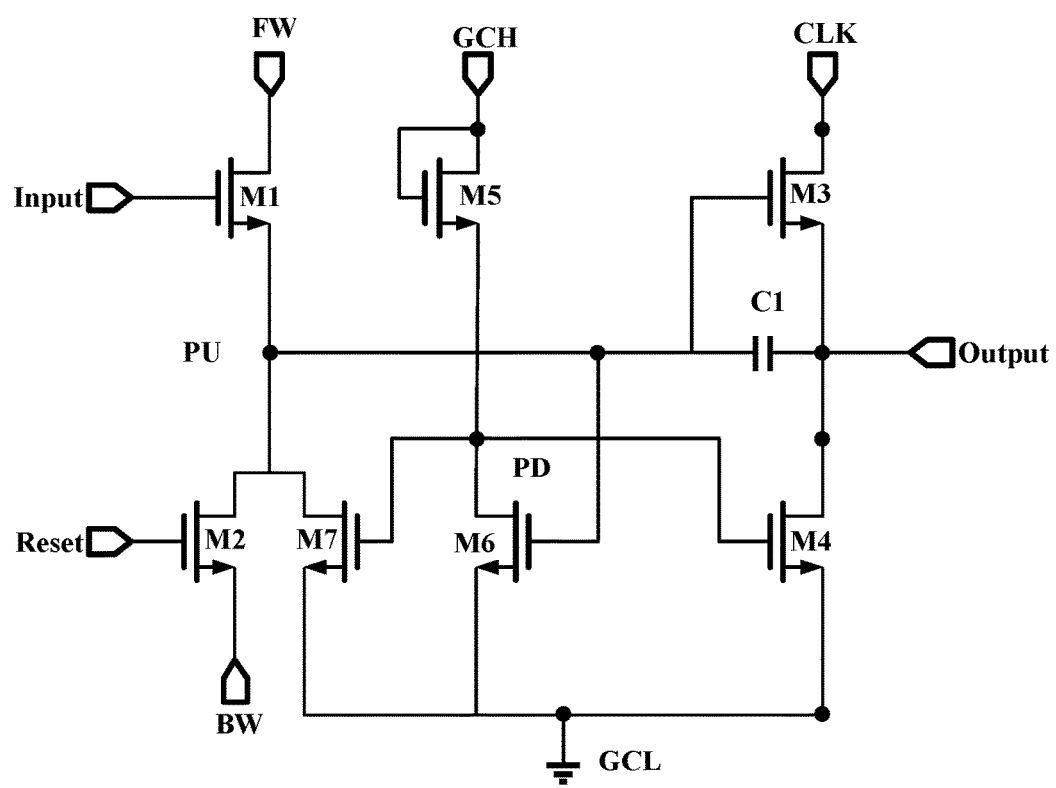
FIG. 1 is a circuit diagram of a conventional shift register unit consisting of seven transistors and one capacitor.
Figure 2:
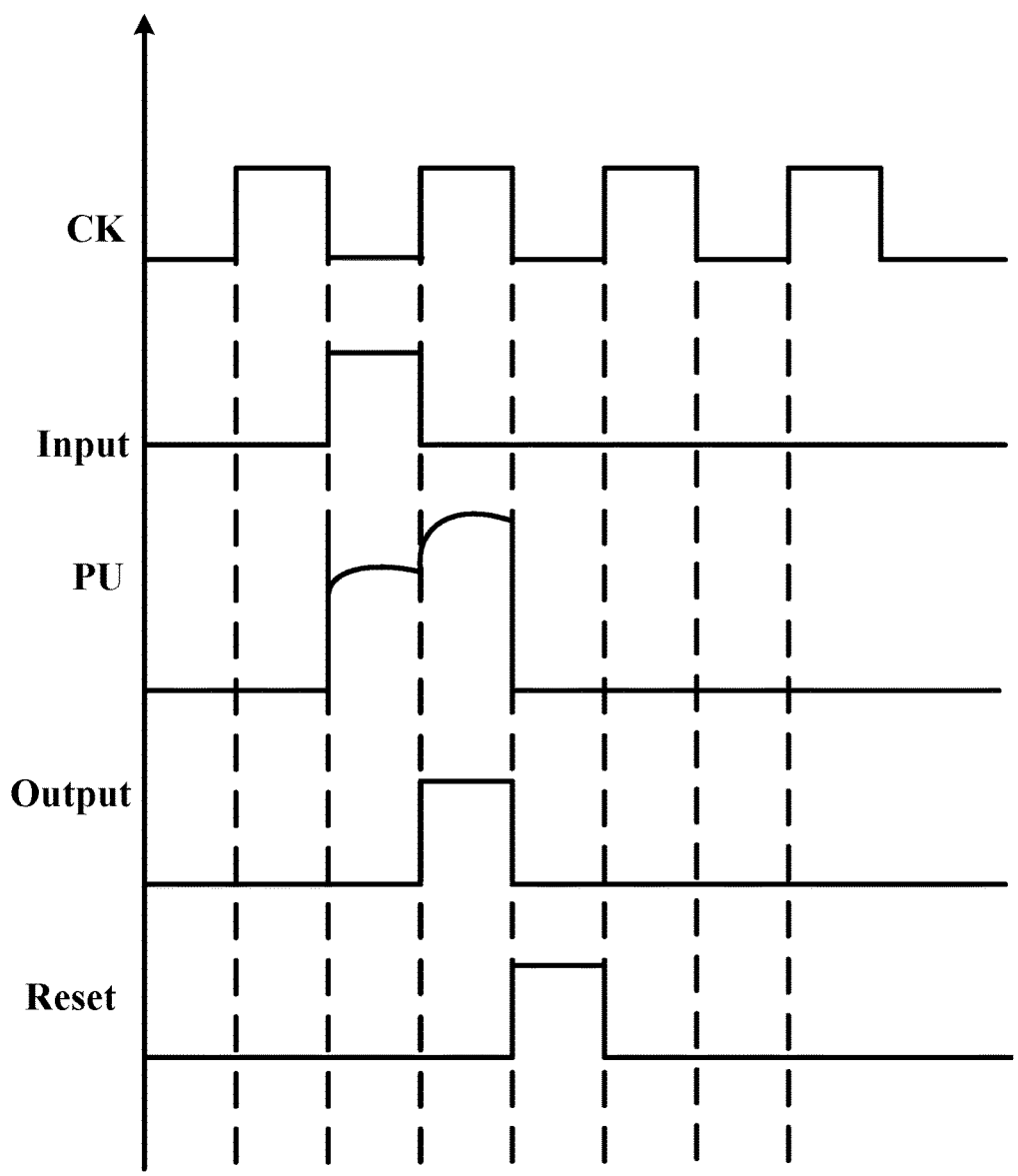
FIG. 2 is a work sequence diagram for the shift register unit shown in FIG. 1.

FIG. 1 shows a conventional GOA circuit, which has the structure of 7T1C, i.e. the circuit consists of 7 transistors (M1~M7) and 1 capacitor (C1). As shown in FIG. 2, the working process thereof includes the following stages. During the first stage, an input signal Input is of a high level, and a clock signal CLK and a reset signal Reset are both low level signals, the transistor M1 is turned on to charge the capacitor C1, a node PU has a high level and the transistor M6 is turned on. Although both transistors M5 and M6 are turned on at this time, by selecting the sizes of the transistors M5 and M6, a node PD can be made to have a low level, so that transistors M4 and M7 are turned off to ensure a normal output. Second stage: the input signal Input is of a low level and M1 is turned off. The capacitor C1 was charged in the first stage, and it can keep the node PU at the high level at this time, and the transistor M3 is turned on. When the clock signal CLK is of a high level, the output signal Output is of a high level. Third stage: both the input signal Input and the clock signal CLK are of a low level, and M1 is turned off; the reset signal Reset is of a high level, the transistor M2 is turned on, the node PU has a low level, and the transistor M3 is turned off; since the node PU is pulled down, the transistor M6 is turned off, the node PD has a high level, the transistors M4 and M7 are turned on, and the output signal is of a low level, namely, the transistors M5, M4 and M7 are turned on simultaneously at this time. It can be seen that when the conventional GOA circuit as shown in FIG. 1 is working, there will be the cases in which the transistors M5 and M6 are turned on simultaneously, and the transistors M5, M7 and M4 are turned on simultaneously, and in these cases, a DC high voltage GCH and a DC low level VGL form a DC path, so DC loss is caused. When the GOA circuit shown in FIG. 1 is used frequently, such DC loss will accumulate continuously, resulting in an increase in the energy consumption of the display device.

Figure 3:
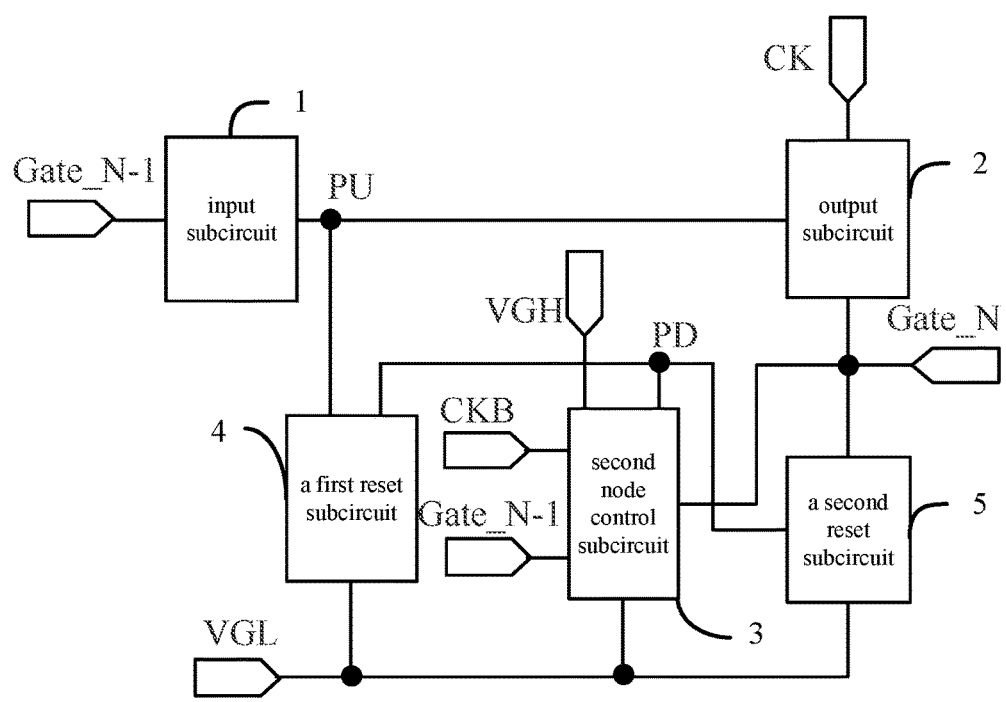
FIG. 3 is a structural diagram of a shift register unit provided in an embodiment of the present disclosure.

An embodiment of the present disclosure provides a shift register unit, as shown in FIG. 3, which comprises an input subcircuit 1, an output subcircuit 2, a second node control subcircuit 3, a first reset subcircuit 4 and a second reset subcircuit 5, and further comprises a scan pulse input terminal Gate_N−1, a first node PU, a second node PD and an output terminal Gate_N.

The input subcircuit 1 is connected to the scan pulse input terminal Gate_N−1 and the first node PU, and is adapted to set the first node PU to a first level when a scan pulse signal is of a first level. The output subcircuit 2 is connected to the first node PU, a first clock signal input terminal CK and an output terminal Gate_N of the shift register unit, and is adapted to enable the output terminal Gate_N to have a level of a first clock signal inputted through the first clock signal input terminal CK when the first node PU is of a first level, and to maintain the level of the first node PU when the first node PU is floating (i.e. a state in which no current or voltage is input into the node PU and the circuits connected thereto). The second node control subcircuit 3 is connected to the scan pulse input terminal Gate_N−1, the output terminal Gate_N of the shift register unit, a second clock signal input terminal CKB, the second node PD, a first level DC voltage terminal VGH and a second level DC voltage terminal VGL, and is adapted to connect the second node PD to the second level DC voltage terminal VGL when the scan pulse signal is of a first level or the output terminal Gate_N is of a first level, and to connect the second node PD to the first level DC voltage terminal VGH when both the scan pulse signal and the output signal of the output terminal Gate_N are of a second level and the second clock signal at the second clock signal input terminal CKB is of a predetermined level. The first reset subcircuit 4 is connected to the first node PU and the second node PD, and is adapted to enable the signal of the first node to be the second level when the second node PD is of a first level. The second reset subcircuit 5 is connected to the second node PD and the output terminal Gate_N, and is adapted to enable the signal of the output terminal Gate_N to be the second level when the second node PD is of the first level.

The "first level" and "second level" mentioned herein refer to two non-overlapping ranges of voltage level at a certain node in a circuit, for example, they can be one of a high level and a low level, respectively, which is not limited to this disclosure.

In order to depict the structures and functions of the above-mentioned units more clearly, the operation principle of the shift register unit will be briefly described below. The operation process of the shift register unit provided in the above embodiment of the present disclosure may include the following stage.

First stage: the scan pulse signal at the scan pulse input terminal Gate_N−1 is of a first level, and the input subcircuit 1 enables the first node PU to be the first level. The first clock signal at the first clock signal input terminal CK is of a second level, the output subcircuit 2 outputs the clock signal (i.e. the second level) at the first clock signal input terminal CK. The second clock signal at the second clock signal input terminal CKB is of a second level, and the second node control subcircuit 3 enables the signal at the second node PD to be the second level to further ensure that the output terminal Gate_N of the shift register unit outputs the second level.

Second stage: the scan pulse input terminal Gate_N−1 is of the second level, then the first clock signal at the first clock signal input terminal CK is of a first level, and the second clock signal at the second clock signal input terminal CKB is of a second level. The input subcircuit 1 does not provide any output, the first node PU has the first level, and the output subcircuit 2 outputs the level (i.e. the first level) of the first clock signal at the first clock signal input terminal CK. Since the output terminal Gate_N outputs the first level, the second node control subcircuit 3 keeps connecting the second node PD with the second level DC voltage terminal VGL so as to maintain the second node PD at the second level, thereby further ensuring that the output terminal Gate_N correctly outputs the first level.

Third stage: the scan pulse input terminal Gate_N−1 is still of the second level, both the first clock signal and the second clock signal are of the second level, and since the first node PU is still of the first level, the output terminal Gate_N outputs the second level.

Fourth stage: the second clock signal at the second clock signal input terminal CKB becomes the predetermined level, then the second node control subcircuit 3 connects the second node PD to the first level DC voltage terminal VGH, so that the signal at the second node PD is of first level. At this time, the first reset subcircuit 4 is activated, so as to enable the signal at the first node PU to be the second level, and the second reset subcircuit 5 is activated to enable the signal at the output terminal Gate_N to be the second level.

In the embodiment of the present disclosure, by means of the second clock signal, the input signal at the scan pulse input terminal and the output signal at the output terminal of the shift register unit, the first voltage input line (which is connected to the first level DC voltage terminal VGH) and the second voltage input line (which is connected to the second level DC voltage terminal VGL) for the shift register unit may not be electrically connected directly, thus a DC loop cannot be formed therebetween directly and the DC loss can be reduced accordingly.

Figure 4:
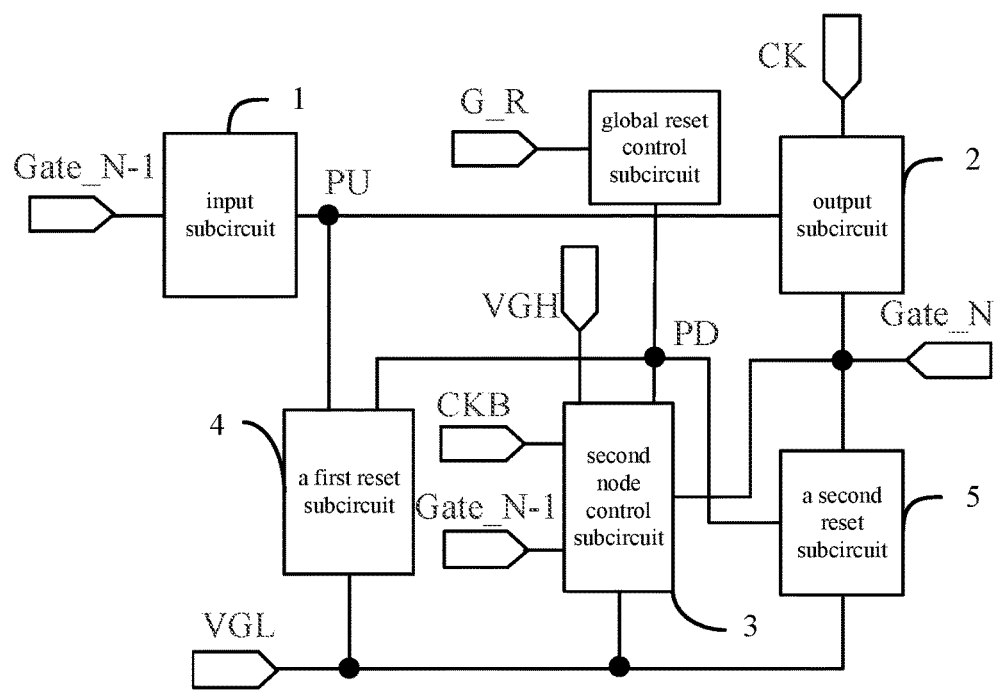
FIG. 4 is a structural diagram of a shift register unit provided in another embodiment of the present disclosure.

In another embodiment, as shown in FIG. 4, the shift register unit provided in the present disclosure further comprises a global reset control subcircuit 6, which is connected to the second node PD and a reset signal input terminal G-R and is adapted to enable the signal at the second node PD to be the first level when the reset signal is of a first level.

Figure 5:
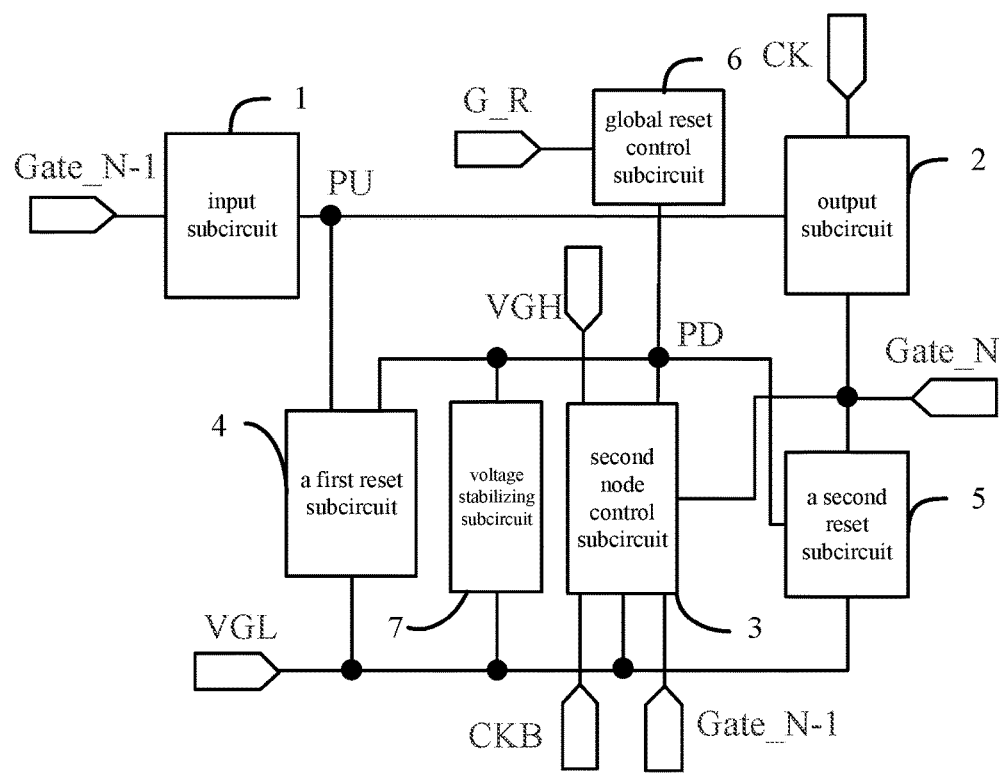
FIG. 5 is a structural diagram of a shift register unit provided in still another embodiment of the present disclosure.

In another embodiment, as shown in FIG. 5, the shift register unit provided in the present disclosure further comprises a voltage stabilizing subcircuit 7 connected to the second node PD and the second level DC voltage terminal VGL for maintaining the level of the second node when the second node PD is floating.

It shall be noted that, the functions of the input subcircuit 1, the output subcircuit 2, the second node control subcircuit 3, the first reset subcircuit 4 and the second reset subcircuit 5 as well as the principle of cooperation among the respective subcircuits are described above, but those skilled in the art should appreciate that any circuit that can achieve corresponding functions can be applied to corresponding subcircuit in the shift register of the present disclosure, and the specific circuits of each of the subcircuits are not limited herein. In addition, the global reset control subcircuit 6 and voltage stabilizing subcircuit 7 can be arranged as desired, and they are not limited by the specific circuits of the input subcircuit 1, the output subcircuit 2, the second node control subcircuit 3, the first reset subcircuit 4 and the second reset subcircuit 5. Circuits of the global reset control subcircuit 6 and the voltage stabilizing subcircuit 7 can also be incorporated into other subcircuits of the shift register unit appropriately, without influencing the shift register unit of the present disclosure avoiding or overcoming the problem of DC loss caused by direct electrical connection between the first voltage line and the second voltage line. That is to say, circuits of the shift register unit formed by combining the circuits of the above-mentioned subcircuits in any way will also fall into the scope of the invention, as long as no influence is imposed in avoiding or overcoming the problem of DC loss caused by direct electrical connection between the first voltage line and the second voltage line.

Figure 6:
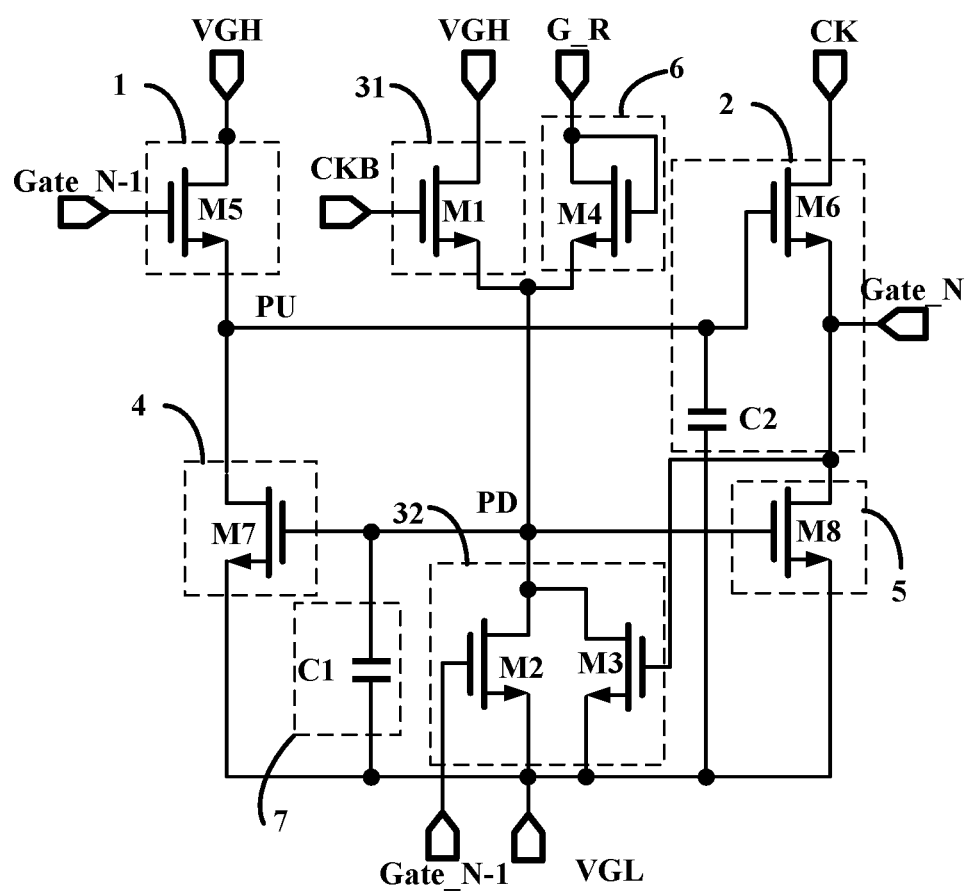
FIG. 6 is a circuit diagram of a shift register unit provided in an embodiment of the present disclosure.

FIG. 6 is a specific circuit diagram of the second node control subcircuit 3 in the shift register unit provided in an embodiment of the present disclosure. Referring to FIG. 6, the second node control subcircuit 3 in this embodiment comprises a first control unit 31 and a second control unit 32. The first control unit 31 is connected to the second node PD and the first level DC voltage terminal VGH, and is adapted to connect the second node PD to the first level DC voltage terminal VGH when the second clock signal at the second clock signal input terminal CKB is of the predetermined level. The second control unit 32 is connected to the scan pulse input terminal Gate_N−1, the output terminal Gate_N, the second node PD and the second level DC voltage terminal VGL, and is adapted to connect the second node PD to the second level DC voltage terminal VGL when the scan pulse input terminal Gate_N−1 is of the first level or the output terminal Gate_N is of the first level.

An example of the second node control subcircuit 3 is described above. Other different implementations can be used, of course, which is not limited herein. In addition, any circuit that can achieve the functions of the first control unit 31 and the second control unit 32 can be applied to corresponding units, which is not limited herein.

To facilitate those skilled in the art to better understand the process of cooperation among the first control unit and the second control unit as well as the rest subcircuits in the embodiment, detailed descriptions are given in an embodiment of the present disclosure by means of a specific example.

Referring to FIG. 6, the first control unit 31 comprises a first transistor M1. A control terminal of the first transistor M1 is connected to the second clock signal input terminal CKB, a first terminal thereof is connected to the second node PD and a second terminal thereof is connected to the first level DC voltage terminal VGH; and a turn-on level for the first transistor M1 is the predetermined level. The second control unit 32 comprises a second transistor M2 and a third transistor M3. Each of the turn-on levels of both the second transistor M2 and the third transistor M3 is the first level. A control terminal of the second transistor M2 is connected to the scan pulse input terminal Gate_N−1, a first terminal thereof is connected to the second node PD, and a second terminal thereof is connected to the second level DC voltage terminal VGL. A control terminal of the third transistor M3 is connected to the output terminal Gate_N, a first terminal thereof is connected to the second node PD and a second terminal thereof is connected to the second level DC voltage terminal VGL.

It can be seen that when the scan pulse signal at the scan pulse input terminal Gate_N−1 is of the first level, the second transistor M2 turns on and the second node PD and the second level DC voltage terminal VGL are connected, so as to set the signal at the second node PD to be the second level. Alternatively, when the output signal at the output terminal Gate_N is of the first level, the third transistor M3 turns on so as to connect the second node PD to the second level DC voltage terminal VGL, thereby enabling the signal at the second node PD to be the second level. When the second clock signal at the second clock signal input terminal CKB is of the predetermined level, the first transistor M1 turns on, so as to connect the second node PD to the first level DC voltage terminal VGH, thereby enabling the signal at the second node PD to be the first level.

The above-mentioned global reset control subcircuit 6 comprises a fourth transistor M4. A first terminal and a control terminal of the fourth transistor M4 are connected to the global reset signal input terminal G_R, a second terminal thereof is connected to the second node PD. A turn-on level of the fourth transistor is the first level. When a reset signal of the first level is input into the global reset signal input terminal G_R, the signal at the second node PD is enabled to be the first level by the fourth transistor M4.

The voltage stabilizing subcircuit 7 comprises a first capacitor C1, with one terminal connected to the second node PD and another terminal connected to the second level DC voltage terminal VGL. It can be appreciated that, when the second node PD has the first level, the first capacitor C1 is charged and it can keep the second node PD to be at the first level, thereby keeping the first reset subcircuit 4 and the second reset subcircuit 5 to be in an activated state.

As an example, the input subcircuit 1 in an embodiment of the present disclosure comprises a fifth transistor M5, as shown in FIG. 6. A control terminal of the fifth transistor M5 is connected to the scan pulse input terminal Gate_N−1, a first terminal thereof is connected to the first level DC voltage terminal VGH, and a second terminal thereof is connected to the first node PU. When the scan pulse signal at the scan pulse input terminal Gate_N−1 has a first level, the first node is connected to the first level DC voltage terminal VGH by the fifth transistor M5, thereby enabling the signal at the first node PU to be the first level.

It shall be noted that, said another terminal of the first capacitor C1 in the embodiment of the present disclosure can also be connected to the second level DC voltage terminal VGH, the output terminal Gate_N or the first clock signal input terminal CK, thus the first capacitor C1 can also achieve the effect of keeping the signal at the second node PD to be the first level.

As a specific example, the output subcircuit 2 in an embodiment of the present disclosure comprises a sixth transistor M6 and a second capacitor C2. A control terminal of the sixth transistor M6 is connected to the first node PU, a first terminal thereof is connected to the first clock signal input terminal CK, and a second terminal thereof is connected to the output terminal Gate_N. One terminal of the second capacitor C2 is connected to the first node PU, and another terminal thereof is connected to the second level DC voltage terminal VGL. When the first node PU is of the first level, the second capacitor C2 is charged, so that when the first node PU is floating, the second capacitor C2 can keep its potential at the first level. In addition, when the first node PU is of the first level, the sixth transistor turns on, so that the first clock signal input terminal CK is connected to the output terminal Gate_N, which in turn enables the output terminal Gate_N to output the first clock signal of the first clock signal input terminal CK.

It shall be noted that said another terminal of the second capacitor C2 in the embodiment of the present disclosure can also be connected to the second level DC voltage terminal VGH, the output terminal Gate_N or the first clock signal input terminal CK, thus the second capacitor C2 can also achieve the effect of keeping the signal of the second node PD to be the first level.

As a specific example, the first reset subcircuit 4 comprises a seventh transistor M7. A control terminal of the seventh transistor M7 is connected to the second node PD, a first terminal thereof is connected to the first node PU, and a second terminal thereof is connected to the second level DC voltage terminal VGL. It can be seen that when the second node PD is of the first level, the seventh transistor M7 turns on, so that the first node PU is connected to the second level DC voltage terminal VGL, thereby enabling the signal at the first node PU to be the second level.

In an embodiment of the present disclosure, the second reset subcircuit 5 comprises a eighth transistor M8. A control terminal of the eighth transistor M8 is connected to the second node PD, a first terminal thereof is connected to the output terminal Gate_N, and a second terminal thereof is connected to the second level DC voltage terminal VGL. It can be seen that when the second node PD is of the first level, the eighth transistor M8 turns on, so that the output terminal Gate_N is connected to the second level DC voltage terminal VGL, thereby enabling the signal of the output terminal Gate_N to be the second level.

In an embodiment, the first level and the predetermined level can be a high level, and the second level can be a low level.

It shall be noted that the first to the eighth transistors M1~M8 in the shift register unit as shown in FIG. 6 are N-type transistors (when the gate has a high level, the source is connected with the drain), so an effective level at the gate thereof is a high level, i.e. the first level. However, in other embodiments of the present invention, the first to the eighth transistors M1~M8 can be replaced with P-type transistors (when the gate has a low level, the source is connected with the drain, i.e. an effective level for the gate is a low level, i.e. the second level), which is not limited in the present disclosure. In addition, the connection of the source and drain of the transistor can be determined by the type of the transistor selected, and when the transistor has a structure in which the source and the drain are symmetric, the source and drain can be considered as two terminals not particularly differentiated from each other, which is well-known to those skilled in the art and not elaborated herein.

Figure 7:
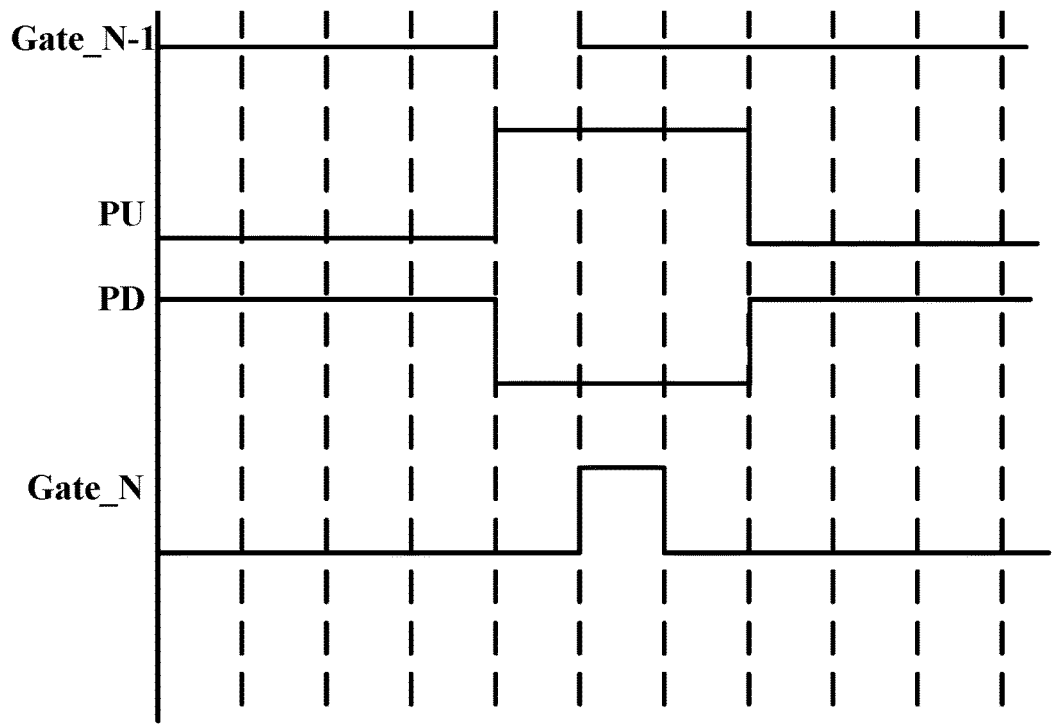
FIG. 7 is a work sequence diagram for the shift register unit shown in FIG. 6.

FIG. 7 is a working sequence diagram for the circuit of the shift register unit provided in an embodiment of the disclosure. The working process of the gate drive circuit shown in FIG. 6 will be described below with reference to FIG. 7.

Referring to FIG. 7, in stage I, the scan pulse signal at the scan pulse input terminal Gate_N-1 is of high level, and the fifth transistor M5 is turned on to connect the first node PU with the first level DC voltage terminal VGH, thereby the signal at the first node PU is of high level. In this stage, the second capacitor C2 is charged, and the first capacitor C1 is discharged. The first node PU has a high level, and the sixth transistor M6 is turned on, so the first clock signal input terminal CK is connected with the output terminal Gate_N. Since the first clock signal input terminal CK has a low level, the output terminal Gate_N of the shift register outputs a low level.

Since the scan pulse input terminal Gate_N-1 is of a high level, the second transistor M2 is turned on so as to connect the second node PD to the first level DC voltage terminal VGL, thereby enabling the signal at the second node PD to be a low level. The seventh transistor M7 and the eighth transistor M8 are off at this time to ensure stability of voltage on the first node PU and stability of output signal of the shift register. The second clock signal at the second clock signal input terminal CKB is of a low level, and the first transistor M1 is off.

It can be appreciated that, in stage I, there is no direct DC path between the first level DC voltage terminal VGL and the second level DC voltage terminal VGH, so no DC loss is caused.

Stage II: the scan pulse input terminal Gate_N-1 has a low level, and the second transistor M2 and fifth transistor M5 are off. Since the second capacitor C2 was charged in stage I, the first node PU is kept to be at a high level. The sixth transistor M6 is still on, and the first clock signal at the first clock signal input terminal CK is of a high level, then the output terminal Gate_N outputs a high level.

Since the output terminal Gate_N outputs a high level, the third transistor M3 is turned on to connect the second node PD with the second level DC voltage terminal VGL, resulting in the second node PD to be of a low level, the seventh transistor M7 and the eighth transistor M8 are turned off to ensure stability of the voltage on the first node PU and stability of the output signal of the shift register. The second clock signal at the second clock signal output terminal CKB is of a low level, and the first transistor M1 is off.

It can be seen that in stage II, there is no direct DC path between the first level DC voltage terminal VGL and the second level DC voltage terminal VGH, so no DC loss is caused.

Stage III: the scan pulse signal at the scan pulse input terminal Gate_N-1 is of low level, and the second transistor M2 and fifth transistor M5 are turned off. The first node PU has a high level, and the first clock signal at the first clock signal input terminal CK is of a low level, then the output terminal Gate_N outputs a low level. The third transistor M3 is turned off. The second clock signal at the second clock signal input terminal CKB is of a low level, then the second node PD remains at the low level as in stage II. The first capacitor C1 will keep the second node PD to be at the low level.

It can be seen that in stage III, no direct DC path is formed between the first level DC voltage terminal VGL and the second level DC voltage terminal VGH, so no DC loss is caused.

In stage IV, the signal at the second clock signal input terminal CKB becomes a high level, and the first transistor M1 is turned on to connect the first level DC voltage terminal VGH with the second node PD, thereby enabling the signal at the second node PD to be a high level, meanwhile, the first capacitor C1 is charged. The seventh transistor M7 and the eighth transistor M8 are turned on. The seventh transistor M7 connects the first node PU with the first level DC voltage terminal VGL, enabling the signal at the first PU to be a low level and the second capacitor C2 to be discharged. The eighth transistor M8 connects the output terminal Gate_N with the first level DC voltage terminal VGL, providing the output terminal Gate_N with a low level.

It can be seen that in stage IV, no direct DC path is formed between the first level DC voltage terminal VGL and the second level DC voltage terminal VGH, so no DC loss is caused.

During any of the above stages, when a reset pulse is input to the global reset signal input terminal G_R, the fourth transistor M4 is turned on to pull the second node PD up to a high level, the seventh transistor M7 and the eighth transistor M8 are switched on at the same time to provide the first node PU and the output terminal Gate_N with a low level, thereby resetting the shift register unit. If the first capacitor C1 is present, it will keep the second node PD at a high level, so that the output terminal Gate_N continuously outputs a low level.

As shown in FIG. 7, in an embodiment of the present disclosure, the scan pulse signal inputted at the scan pulse input terminal Gate_N−1 is a scan pulse whose effective level is the first level. The first clock signal is inputted to the first clock signal input terminal CK, and the second clock signal is inputted to the second clock signal input terminal CKB. The duty ratio for the first level of the first clock signal is same to that of the second clock signal, and a width of one first level in the first clock signal and a width of one first level of the second clock signal are both equal to a width of the effective level of the scan pulse signal. As shown in FIG. 7, a start time of one effective level of the scan pulse signal is an end time of one first level of the second clock signal, and an end time of the effective level of the scan pulse signal is a start time of a first level of the first clock signal, which is adjacent to the effective level of the scan pulse signal. That is, in one time period as shown in FIG. 7, the effective level of the scan pulse signal is exactly between a first level signal of the second clock signal CKB and a first level signal of the first clock signal immediately following said first level signal of the second clock signal.

In the embodiments of the present disclosure, by means of the scan pulse signal at the scan pulse input terminal Gate_N−1, the second clock signal at the second clock signal input terminal CKB, the first clock signal at the first clock signal input terminal CK and the output signal at the output terminal Gate_N of the shift register, it is possible that there is no direct DC path between the first level DC voltage terminal VGL and the second level DC voltage terminal VGH, thus alleviating or solving the problem of high DC loss of the shift register unit in the prior art.

In another aspect, the present disclosure further provides a driving method for the shift register unit as described above. Referring to FIG. 7, the driving method comprises the following steps.

Providing a scan pulse signal with an effective level of the first level to the scan pulse input terminal Gate_N−1, providing a first clock signal to the first clock signal input terminal CK, and providing a second clock signal to a second clock signal input terminal CKB. The duty ratio of the first level of the first clock signal is the same with that of the second clock signal, and each of a width of one first level of the first clock signal and a width of one first level of the second clock signal is equal to a width of an effective level of the scan pulse signal. In one time period, a start time of an effective level of the scan pulse signal is an end time of a first level of the second clock signal, and an end time thereof is a start time of a first level of the first clock signal, which is adjacent to the effective level of the scan pulse signal.

Figure 8:
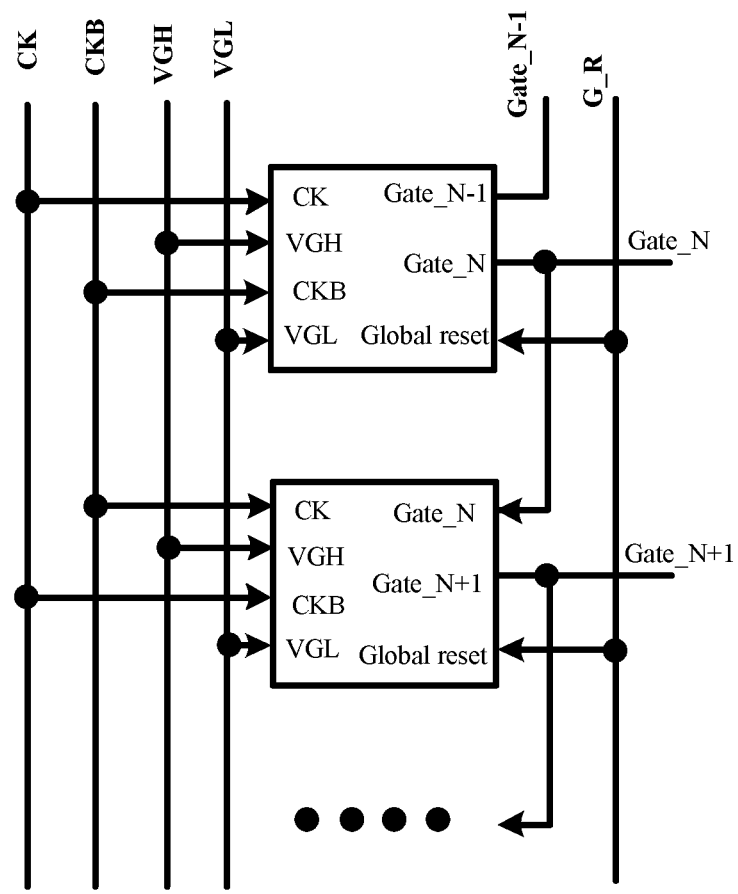
FIG. 8 is a structural diagram of gate drive circuit provided in an embodiment of the present disclosure.

Further, another embodiment of the present disclosure provides a gate drive circuit, which, as shown in FIG. 8, comprises a plurality of cascaded shift register units, the shift register unit being any of the shift register unit described in the above embodiments. It shall be noted that, for two adjacent shift register units in the gate drive circuit, clock signals received by the first clock signal input terminal CK and the second clock signal input terminal CKB of one shift register unit are opposite to clock signals received by the first clock signal input terminal CK and the second clock signal input terminal CKB of the other shift register unit. Referring to FIG. 8, the first clock signal input terminal CK and the second clock signal input terminal CKB of one shift register unit receive a first clock signal and a second clock signal, respectively, while the first clock signal input terminal CK and the second clock signal input terminal CKB of the following shift register unit receive the second clock signal and the first clock signal, respectively. However, the working principles of the two shift register units are the same, which will not be elaborated herein.

Still another embodiment of the present disclosure provides a display device, which comprises the shift register unit or gate drive circuit described in any of the above embodiments. The display device in this embodiment can be any product or component having a display function, such as a display panel, electronic paper, a mobile phone, a tablet PC, a TV, a laptop, a digital photo frame, a navigator, etc.

Since both the gate drive circuit and the display device provided in the present disclosure comprise the shift register unit provided in the embodiments of the present disclosure, they can achieve the same technical effect, so they will not be reiterated herein.

Many specific details have been described in the description of the present application, but it shall be understood that embodiments of the present disclosure can be implemented without these specific details. In some examples, well-known methods, structures and techniques are not illustrated in detail so as not to obscure the understanding of this description.

Likewise, it shall be understood that in order to simplify the disclosure and to facilitate understanding to one or more of the disclosed aspects, in the above descriptions about the exemplary embodiments of the present disclosure, the features are sometimes grouped to a single embodiment, drawing or description thereof. However, what has been descried shall not be construed as being intended to make the claimed invention to seek to include more features than those explicitly recited in each claim. To be more specific, as reflected by the claims, the claimed technical solution may be less than all features of a single embodiment described in the description. Therefore, the claims complying with an embodiment are explicitly incorporated into the embodiment, each claim per se is considered as an individual embodiment of the present disclosure.

In the description of the present disclosure, the directional or positional relationship indicated by such terms as "on" and "under" are directional or positional relationship as shown in the drawings, and they are only intended to facilitate illustration of the present disclosure and to simplify description, rather than indicating or suggesting that the related device or element must have a specific direction and position or be constructed and operated in a specific direction and position, so they shall not be construed as limiting the present invention. Unless other specified and defined, terms "mount", "connect" and "connected" should be interpreted in a broadest sense, for example, they may mean a fixed connection, a detachable connection, an integral connection, a mechanical connection or an electrical connection. Or they may mean a direct connection or an indirect connection through a media. Further, they may mean the interconnection inside two elements. Those skilled in the art can understand the specific meaning of said terms in the present disclosure according to the specific situations.

It shall also be noted that such terms as "first" and "second" are merely used to differentiate one entity or operation from another, but they do not necessarily require or suggest that the entities of operations are actually in the sequence or related in a particular manner. The words "include", "comprise" or any other variants thereof are non-exclusive, so that a process, method, article or device including a series of elements will not only include these elements but may also include other elements that are not listed explicitly, or they also include elements inherent to said process, method, article or device. If no further limitation is given, the wording "comprising a . . . " does not exclude the case that the process, method, article or device comprising said element also has other elements.

The above embodiments are merely for illustrating rather than limiting the technical solutions of the invention. Although the present disclosure has been described in detail with reference to the above embodiments, those skilled in the art shall understand that technical solutions recited in the above embodiments can be modified or some of the technical features thereof can be substituted equivalently, while these modifications or substitutions will not make the corresponding technical solution to substantially depart from the spirit and scope of the technical solutions of the embodiments of the present disclosure.

The invention claimed is:

1. A shift register unit comprising an input subcircuit, an output subcircuit, a first reset subcircuit, a second reset subcircuit and a second node control subcircuit, wherein the input subcircuit is connected to a scan pulse input terminal and a first node, and is adapted to drive a voltage of the first node to be a first level when a scan pulse signal is of the first level,
wherein the output subcircuit is connected to the first node, a first clock signal input terminal and an output terminal of the shift register unit, and is adapted to drive a voltage of the output terminal to be a level of a first clock signal inputted through the first clock signal input terminal when the voltage of the first node is of the first level, and to maintain the level of the first node when the first node is floating,
wherein the second node control subcircuit is connected to the scan pulse input terminal, the output terminal of the shift register unit, a second clock signal input terminal, a second node, a first level DC voltage terminal and a second level DC voltage terminal, and is adapted to connect the second node with the second level DC voltage terminal when either of the scan pulse signal and an output signal of the output terminal is of the first level, and to connect the second node with the first level DC voltage terminal when each of the scan pulse signal and the output signal of the output terminal is of the second level and the second clock signal is of a predetermined level,
wherein the first reset subcircuit is connected to the first node and the second node, and is adapted to drive the voltage of the first node to be the second level when the voltage of the second node is of the first level, and
wherein the second reset subcircuit is connected to the second node and the output terminal, and is adapted to drive the output signal of the output terminal to be the second level when the voltage of the second node is of the first level.

2. The shift register unit according to claim 1, wherein the second node control subcircuit comprises a first control unit and a second control unit, wherein the first control unit is connected to the second node and the first level DC voltage terminal, and is adapted to connect the second node with the first level DC voltage terminal when the second clock signal is of the predetermined level,
wherein the second control unit is connected to the scan pulse input terminal, the output terminal, the second node and the second level DC voltage terminal, and is adapted to connect the second node with the second level DC voltage terminal when either of the scan pulse signal of the scan pulse input terminal and the output signal of the output terminal is of the first level.

3. The shift register unit according to claim 2, wherein the first control unit comprises a first transistor, with its control terminal connected to the second clock signal input terminal, its first terminal connected to the second node, and its second terminal connected to the first level DC voltage terminal, wherein a turn-on level for the first transistor is the predetermined level.

4. The shift register unit according to claim 2, wherein the second control unit comprises a second transistor and a third transistor, and turn-on levels for the second transistor and the third transistor are both the first level,
wherein a control terminal of the second transistor is connected to the scan pulse input terminal, a first terminal thereof is connected to the second node, and the second terminal thereof is connected to the second level DC voltage terminal,
wherein a control terminal of the third transistor is connected to the output terminal, a first terminal thereof is connected to the second node and a second terminal thereof is connected to the second level DC voltage terminal.

5. The shift register unit according to claim 1, further comprising a global reset control subcircuit, wherein the global reset control subcircuit is connected to the first node and a reset signal input terminal, and is adapted to drive the voltage of the second node to be the first level when a reset signal at the reset signal input terminal is of the first level.

6. The shift register unit according to claim 5, wherein the global reset control subcircuit comprises a fourth transistor, with its first terminal and control terminal connected to the reset signal input terminal, and its second terminal connected to the second node, and wherein a turn-on level for the fourth transistor is the first level.

7. The shift register unit according to claim 1, further comprising a voltage stabilizing subcircuit connected to the second node, for maintaining the level of the second node when the second node is floating.

8. The shift register unit according to claim 7, wherein the voltage stabilizing subcircuit comprises a first capacitor, one terminal of the first capacitor is connected to the second node, and the other terminal of the first capacitor is connected to one of the first level DC voltage terminal and the second level DC voltage terminal.

9. The shift register unit according to claim 1, wherein the input subcircuit comprises a fifth transistor, with its control terminal connected to the scan pulse input terminal, its first terminal connected to the first level DC voltage terminal, and its second terminal connected to the first node.

10. The shift register unit according to claim 1, wherein the output subcircuit comprises a sixth transistor and a second capacitor,
wherein a control terminal of the sixth transistor is connected to the first node, a first terminal thereof is connected to the first clock signal input terminal, and a second terminal thereof is connected to the output terminal;
wherein one terminal of the second capacitor is connected to the first node and the other terminal of the second capacitor is connected to one of the first level DC voltage terminal and the second level DC voltage terminal.

11. The shift register unit according to claim 1, wherein the first reset subcircuit comprises a seventh transistor, with its control terminal connected to the second node, its first terminal connected to the first node and its second terminal connected to the second level DC voltage terminal.

12. The shift register unit according to claim 1, wherein the second reset subcircuit comprises an eighth transistor, with its control terminal connected to the second node, its first terminal connected to the output terminal and its second terminal connected to the second level DC voltage terminal.

13. The shift register unit according to claim 1, wherein each of the first level and the predetermined level is a high level, and the second level is a low level.

14. A driving method for the shift register unit according to claim 1, comprising:
providing a scan pulse signal whose effective level is the first level to the scan pulse input terminal;
providing a first clock signal to the first clock signal input terminal, and providing a second clock signal to the second clock signal input terminal,
wherein a duty ratio for the first level of the first clock signal is same to that of the second clock signal, and both a width of each first level of the first clock signal and a width of each first level of the second clock signal are equal to a width of an effective level of the scan pulse signal;
wherein during one time period, a start time of the effective level of the scan pulse signal is an end time of one first level of the second clock signal, and an end time of the effective level of the scan pulse signal is a start time of a first level of the first clock signal, which is adjacent to the effective level of the scan pulse signal.

15. A gate drive circuit, comprising a plurality of cascaded shift register units according to claim 1.

16. The gate drive circuit according to claim 15, wherein the second node control subcircuit comprises a first control unit and a second control unit, wherein the first control unit is connected to the second node and the first level DC voltage terminal, and is adapted to connect the second node with the first level DC voltage terminal when the second clock signal is of the predetermined level,
wherein the second control unit is connected to the scan pulse input terminal, the output terminal, the second node and the second level DC voltage terminal, and is adapted to connect the second node with the second level DC voltage terminal when either of the scan pulse signal of the scan pulse input terminal and the output signal of the output terminal is of the first level.

17. The gate drive circuit according to claim 16, wherein the first control unit comprises a first transistor, with its control terminal connected to the second clock signal input terminal, its first terminal connected to the second node, and its second terminal connected to the first level DC voltage terminal, wherein a turn-on level for the first transistor is the predetermined level.

18. The gate drive circuit according to claim 16, wherein the second control unit comprises a second transistor and a third transistor, and turn-on levels for the second transistor and the third transistor are both the first level,
wherein a control terminal of the second transistor is connected to the scan pulse input terminal, a first terminal thereof is connected to the second node, and the second terminal thereof is connected to the second level DC voltage terminal,
wherein a control terminal of the third transistor is connected to the output terminal, a first terminal thereof is connected to the second node and a second terminal thereof is connected to the second level DC voltage terminal.

19. The gate drive circuit according to claim 15, further comprising a global reset control subcircuit, wherein the global reset control subcircuit is connected to the first node and a reset signal input terminal, and is adapted to drive the voltage of the second node to be the first level when a reset signal at the reset signal input terminal is of the first level.

20. A display device, comprising the gate drive circuit according to claim 15.

* * * * *